United States Patent
Im et al.

(10) Patent No.: US 12,153,342 B2
(45) Date of Patent: Nov. 26, 2024

(54) NANOFABRICATION METHOD WITH CORRECTION OF DISTORTION WITHIN AN IMPRINT SYSTEM

(71) Applicant: CANON KABUSHIKI KAISHA, Tokyo (JP)

(72) Inventors: Se-Hyuk Im, Austin, TX (US); Anshuman Cherala, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 17/823,411

(22) Filed: Aug. 30, 2022

(65) Prior Publication Data

US 2024/0066786 A1 Feb. 29, 2024

(51) Int. Cl.
| | | |
|---|---|---|
| G03F 7/00 | (2006.01) | |
| B29C 59/00 | (2006.01) | |
| B29C 59/02 | (2006.01) | |
| B82Y 40/00 | (2011.01) | |
| B29C 37/00 | (2006.01) | |

(52) U.S. Cl.
CPC .......... *G03F 7/0002* (2013.01); *B29C 59/002* (2013.01); *B29C 59/026* (2013.01); *B82Y 40/00* (2013.01); *B29C 2037/903* (2013.01)

(58) Field of Classification Search
CPC .................................................... G03F 7/0002
USPC .......................................................... 716/54
See application file for complete search history.

(56) References Cited

U.S. PATENT DOCUMENTS

| | | | |
|---|---|---|---|
| 6,936,194 | B2 | 8/2005 | Watts |
| 7,157,036 | B2 | 1/2007 | Choi et al. |
| 8,066,930 | B2 | 11/2011 | Sreenivasan et al. |
| 8,076,386 | B2 | 12/2011 | Xu et al. |
| 8,119,052 | B2 | 2/2012 | Schumaker |
| 8,349,241 | B2 | 1/2013 | Sreenivasan et al. |
| 8,394,282 | B2 | 3/2013 | Avinash et al. |
| 9,987,653 | B2 | 6/2018 | Sreenivasan et al. |
| 9,993,962 | B2 | 6/2018 | Cherala |
| 10,553,501 | B2 | 2/2020 | Cherala et al. |

(Continued)

OTHER PUBLICATIONS

Cherala, A., et al., "Addressing Nanoimprint Lithography Mix & Match Overlay Using Drop Pattern Compensation", Proc. of SPIE, Article 113240C, 2020, pp. 1-10, vol. 11324.

*Primary Examiner* — Eric D Lee
(74) *Attorney, Agent, or Firm* — Canon U.S.A., Inc. I.P. Division

(57) ABSTRACT

A nanofabrication method comprises receiving information regarding in-plane distortion of a substrate, modeling target out-of-plane displacement as a summation of a plurality of geometric modes represented by a linear combination of basis functions, generating a first drop pattern of formable material based on the modeled out-of-plane displacement, generating a second drop pattern by merging the first drop pattern with a drop pattern based on a topography of the template and the substrate; dispensing drops of formable material onto the substrate according to the second drop pattern, and contacting the dispensed drops with the template to form a film. The plurality of geometric modes are modified using a plurality of unique predetermined correction coefficients. Each unique predetermined correction coefficient represents a relationship between an analytically determined amount of in-plane distortion and an empirically determined amount of in-plane distortion.

19 Claims, 13 Drawing Sheets

(56) References Cited

U.S. PATENT DOCUMENTS

2019/0079013 A1 3/2019 Chou
2021/0191257 A1* 6/2021 Choi .................... G03F 7/0002

* cited by examiner

NANOFABRICATION METHOD WITH CORRECTION OF DISTORTION WITHIN AN IMPRINT SYSTEM

BACKGROUND

Field of Art

The present disclosure relates to a nanofabrication method, and in particular, a nanofabrication method that corrects for distortion within an imprint system.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, optical components, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

U.S. Pat. No. 9,993,962 discloses a method for imprinting to correct for a distortion within an imprint system to improve overlay. The method disclosed in the '962 patent performs the correction using a modified drop pattern dispensed during an imprint process. However, there is room to improve the overlay correction achieved by the method disclosed in the '962 patent.

SUMMARY

A nanofabrication method comprises receiving information regarding in-plane distortion of a substrate, modeling target out-of-plane displacement of the template as a summation of a plurality of geometric modes, each geometric mode of the plurality of geometric modes represented by a linear combination of basis functions in two dimensions, wherein the plurality of geometric modes in the summation are modified using a plurality of unique predetermined correction coefficients, wherein each unique predetermined correction coefficient of the plurality of unique predetermined correction coefficients is assigned to a particular geometric mode of the plurality of geometric modes, and wherein each unique predetermined correction coefficient of the plurality of unique predetermined correction coefficients represents a relationship between: a) an analytically determined amount of in-plane distortion caused to the template when the template is contacted with formable material dispensed according to a mode drop pattern based on the particular geometric mode, and b) an empirically determined amount of in-plane distortion caused to the template when the template is contacted with formable material dispensed according to the mode drop pattern, generating a first drop pattern of formable material based on the modeled out-of-plane displacement of the template, generating a second drop pattern by merging the first drop pattern with a third drop pattern, wherein the third drop pattern is based on a topography of the template and the substrate, dispensing drops of formable material onto the substrate according to the second drop pattern, and contacting the dispensed drops with the template to form a film.

A nanofabrication system comprises a first chuck configured to hold a template, a second chuck configured to hold a substrate, a processor configured to: receive information regarding in-plane distortion of the substrate, model target out-of-plane displacement of the template as a summation of a plurality of geometric modes, each geometric mode of the plurality of geometric modes represented by a linear combination of basis functions in two dimensions, wherein the plurality of geometric modes in the summation are modified using a plurality of unique predetermined correction coefficients, wherein each unique predetermined correction coefficient of the plurality of unique predetermined correction coefficients is assigned to a particular geometric mode of the plurality of geometric modes, and wherein each unique predetermined correction coefficient of the plurality of unique predetermined correction coefficients represents a relationship between: a) an analytically determined amount of in-plane distortion caused to the template when the template is contacted with formable material dispensed according to a mode drop pattern based on the particular geometric mode, and b) an empirically determined amount of in-plane distortion caused to the template when the template is contacted with formable material dispensed according to the mode drop pattern, generate a first drop pattern of formable material based on the modeled out-of-plane displacement of the template, generate a second drop pattern by merging the first drop pattern with a third drop pattern, wherein the third drop pattern is based on a topography of the template and the substrate, a fluid dispenser configured to dispense formable material on the substrate in accordance with the second drop pattern, a positioning system configured to contact the formable material with the template, and a curing system configured to cure the formable material under the template so as to form cured formable material on the substrate.

A method of making an article comprises receiving information regarding in-plane distortion of a substrate, modeling target out-of-plane displacement of the template as a summation of a plurality of geometric modes, each geometric mode of the plurality of geometric modes represented by a linear combination of basis functions in two dimensions, wherein the plurality of geometric modes in the summation are modified using a plurality of unique predetermined correction coefficients, wherein each unique predetermined correction coefficient of the plurality of unique predetermined correction coefficients is assigned to a particular geometric mode of the plurality of geometric modes, and wherein each unique predetermined correction coefficient of the plurality of unique predetermined correction coefficients represents a relationship between: a) an analytically determined amount of in-plane distortion caused to the template when the template is contacted with formable material dispensed according to a mode drop pattern based on the particular geometric mode, and b) an empirically determined amount of in-plane distortion caused to the template when the template is contacted with formable material dispensed according to the mode drop pattern, generating a first drop pattern of formable material based on the modeled out-of-plane displacement of the template, generating a second drop pattern by merging the first drop pattern with a third drop pattern, wherein the third drop pattern is based on a topography of the template and the substrate, dispensing drops of formable material according to the second drop pattern onto the substrate, and contacting the template with the dispensed drops, thereby forming a pattern of the dispensed drops on the substrate, and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
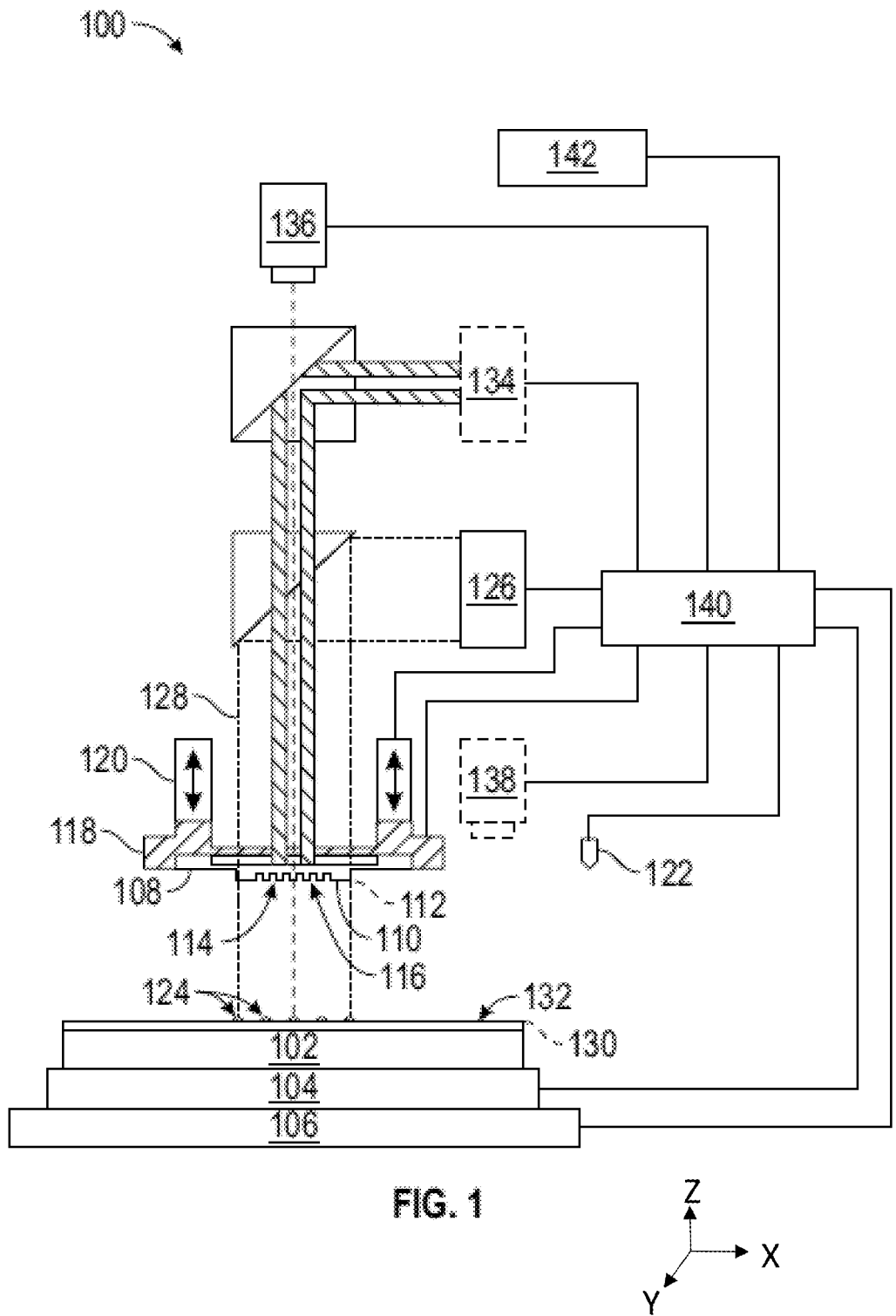
FIG. 1 is an illustration of an example nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

As noted above, a known drop pattern correction method (described in the '962 patent) corrects distortion within an imprint system to improve overlay. However, it desirable for a nanofabrication method that better corrects for distortion within an imprint system to improve overlay than the method described in the '962 patent.

Nanofabrication System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

The template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc., which are configured to move the template chuck 118 relative to the substrate in at least the z-axis direction, and potentially other directions (e.g., x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 124. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g., UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
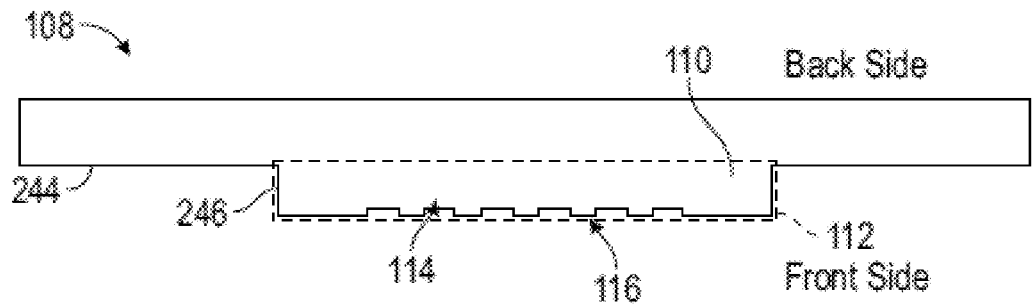
FIG. 2 is an illustration of an example template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
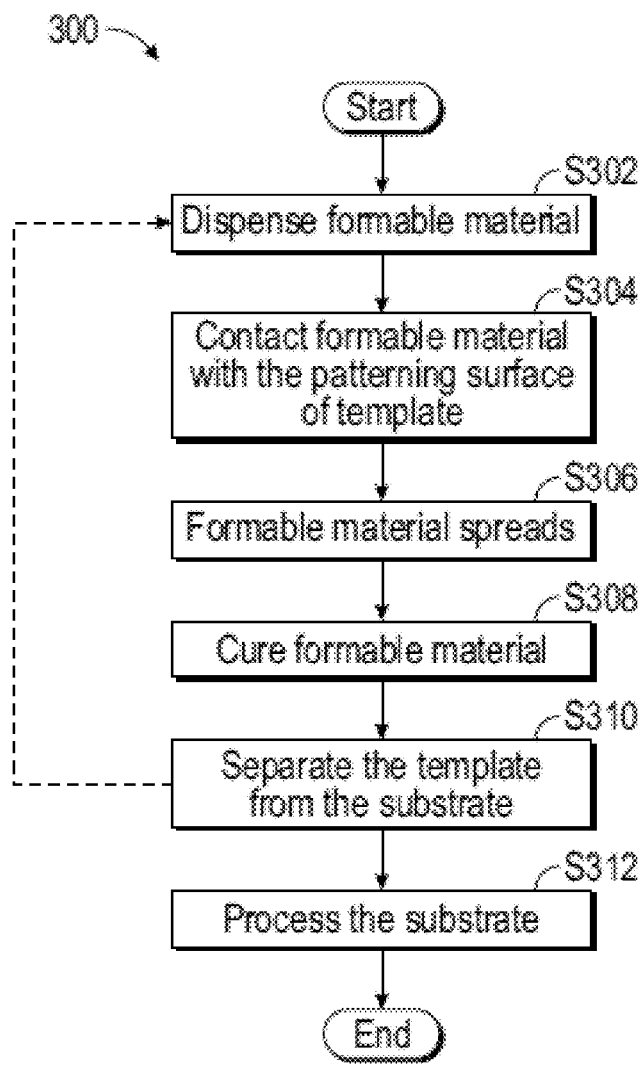
FIG. 3 is a flowchart illustrating an example nanofabrication method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g., semiconductor device or an optical component). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

As noted above, the imprint system 100 may have distortion within the system that will negatively impact overlay unless accounted for. Overlay is the registration or alignment of one pattern layer to a second pattern layer and is important for the final article of manufacture (e.g., electronic device) to function correctly. For example, flatness or planarity deviations in the chuck can cause in-plane distortions in the substrate as the substrate conforms to the chuck. Even if the chuck is ideally flat, planarity deviations can exist in the wafer itself that similarly lead to in-plane distortions once the substrate is chucked. Further distortions can be introduced when an imprint template conforms to a non-flat substrate, likewise causing in-plane distortions in the template. These distortions all affect overlay accuracy. U.S. Pat. No. 9,993,962 (hereinafter the '962 patent) discloses an imprint process that compensates for these distortions, and is incorporated by reference herein. The '962 patent discloses how to generate a particular drop pattern to be dispensed during the imprinting process. In one embodiment, the method disclosed therein includes determining a dispense pattern for the formable material based at least in part on the distortion, wherein the dispense pattern is performed such that the formable material is to be dispensed to a first areal density within a first area, where the distortion indicates that the at least one protrusion and a primary surface of the substrate will be further apart when the template contacts the formable material within the first area; and a second areal density within a second area, where the distortion indicates that the at least one protrusion and the primary surface of the substrate will be closer to each other when the template contacts the formable material within the second area, wherein the first areal density is greater than the second areal density.

As explained in the '962 patent, the method can include quantifying a distortion within the imprint system. Quantifying the distortion can include determining a deviation in planarity along a surface of a component within the imprint apparatus. The deviation in planarity may be measured as flatness along the primary surface of the chucking region, the primary surface of the substrate, along the primary surface of the mold, or any combination thereof. The flatness is measured along the primary surface of the substrate when it is over the chucking region of the substrate chuck. The flatness may be measured for the entire or nearly the entire substrate (for example, all imprint fields), a single imprint field, a selected combination of imprint fields (for example, the particular imprint field and immediately adjacent imprint fields), or the like. For regions that are lower in elevation, a higher areal density of formable material will be dispensed, and for regions that are higher in elevation, a lower areal density of formable material will be dispensed.

As explained in the '962 patent, another distortion can be a magnification or orthogonality distortion. A previously formed pattern in the substrate may be too small or too large as compared to the mold of the template. Such magnification distortions can be quantified by comparing the outer dimensions of the previously formed pattern in the substrate to the outer dimensions of the mold. If the previously formed pattern is too small relative to the mold of the template, a higher density of formable material can be dispensed near the center, as compared to the periphery, of the imprint field to cause the mold to have a concave surface, which reduces the size of the field to be printed within the formable material. If the previously formed pattern is too large relative to the mold of the template, a higher density of formable material can be dispensed near the periphery, as compared to the center, of the imprint field to cause the mold to have a convex surface, which increases the size of the field to be printed within the formable material. Similar approaches can be undertaken to correct for orthogonality distortions, such as skew and trapezoidal distortions.

As explained in the '962 patent, the method can further include determining a dispense pattern for the formable material. Information regarding the pattern of the mold, distortion within the system, and potentially other information is received by the processor from the memory, a metrology tool (for example, an interferometer, a profilometer, or the like), from an external source (for example, an integrated circuit layout file, a GDSII file, or an OASIS file is in an external memory, not illustrated), state information during exposure (temperature, humidity, energy source, areal energy density during exposure, or the like) or other suitable information that can affect patterning for the formable material.

Additional details for generating a drop pattern to account for imprint system distortion can be found in the '962 patent.

Nanofabrication Method

Figure 4:
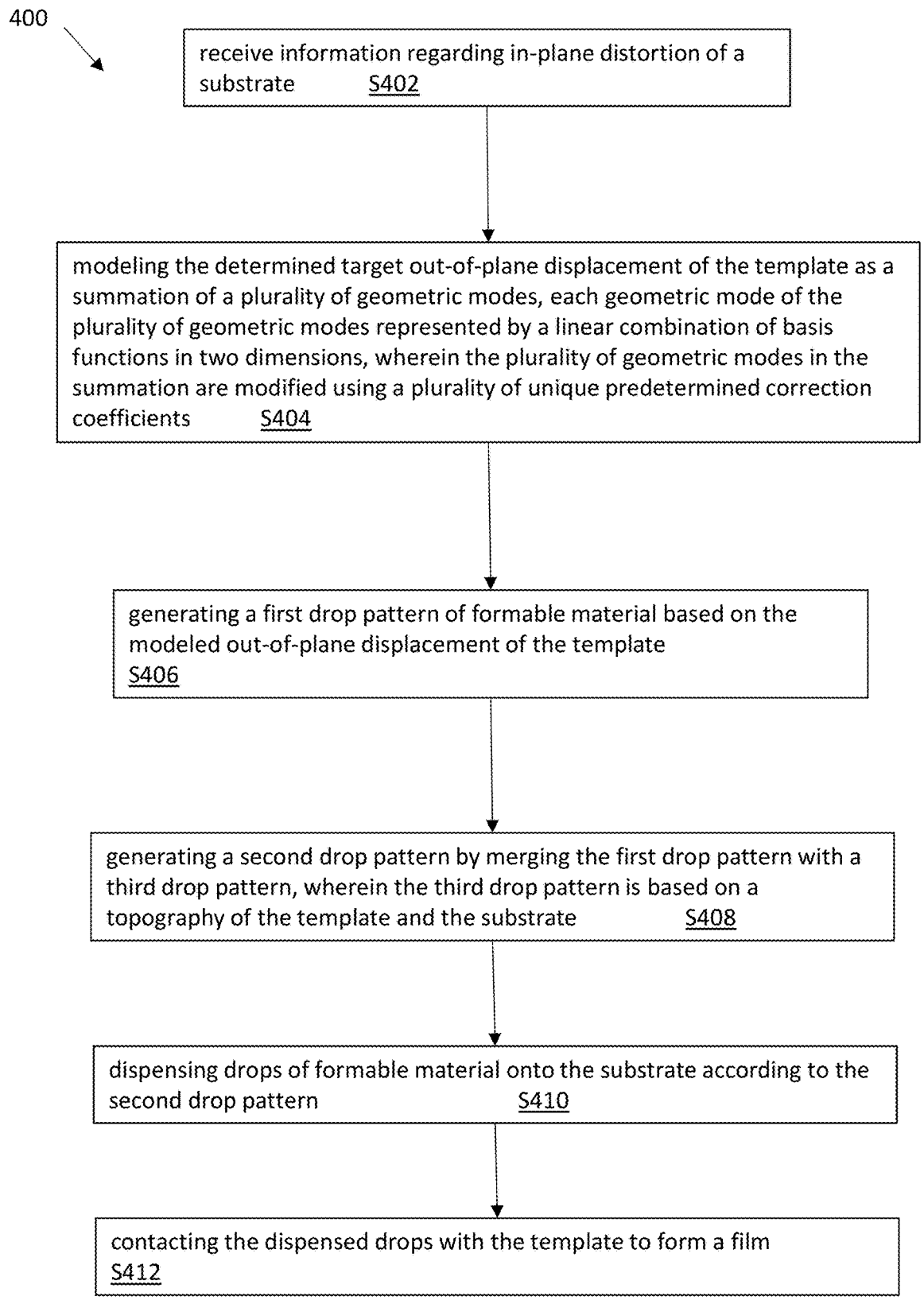
FIG. 4 is a flowchart illustrating an example nanofabrication method in accordance with an example embodiment.

FIG. 4 is a flowchart illustrating an exemplary nanofabrication method 400 in accordance with an example embodiment. The nanofabrication method begins with step S402, where information regarding in-plane distortion of the substrate 102 is received. In the example method 400 shown in FIG. 4, the in-plane distortion information has already been determined and is being received in step S402. However, in another example embodiment, the nanofabrication method may include the step of determining the information regarding the in-plane distortion of the substrate 102 prior to receiving the information regarding the in-plane distortion. Determining the in-plane distortion of the substrate is one example of "quantifying a distortion within the imprint system."

One example method of determining the in-plane distortion of the substrate may include using an overlay metrology system, such as an overlay metrology system manufactured by KLA-Tencor Corporation. Known overlay metrology systems include the Archer™ 200, Archer™ 300, Archer™ 500, Archer™ 600, Archer™ 700, and Archer™ 750. The use of overlay metrology systems to quantify overlay deviation is known in the art. When used to analyze the deviation in the substrate, the overlay metrology system provides a plurality of data points indicating a deviation between a reference position and an actual measured position. Each measured data point includes the deviation amount in the X dimension and the deviation amount in the Y dimension for a particular actual position relative to the corresponding reference position. For example, the measurement of deviation between an actual point and the corresponding reference point may be performed for 100-1500 different locations for every full field and performed for 50-1000 different locations for every partial field. In an embodiment, the number of measurements for a full field may be 125 to 150 and the number of measurements for a partial field may be 70 to 130. In an embodiment, the number of measurements for a full field is 143. The measurements may be performed for every full field and partial field spanning the entire substrate. In some embodiments, the overlay measurements are not performed on some of the partial fields (e.g., 10-20% or less of the total partial fields).

Figure 5:
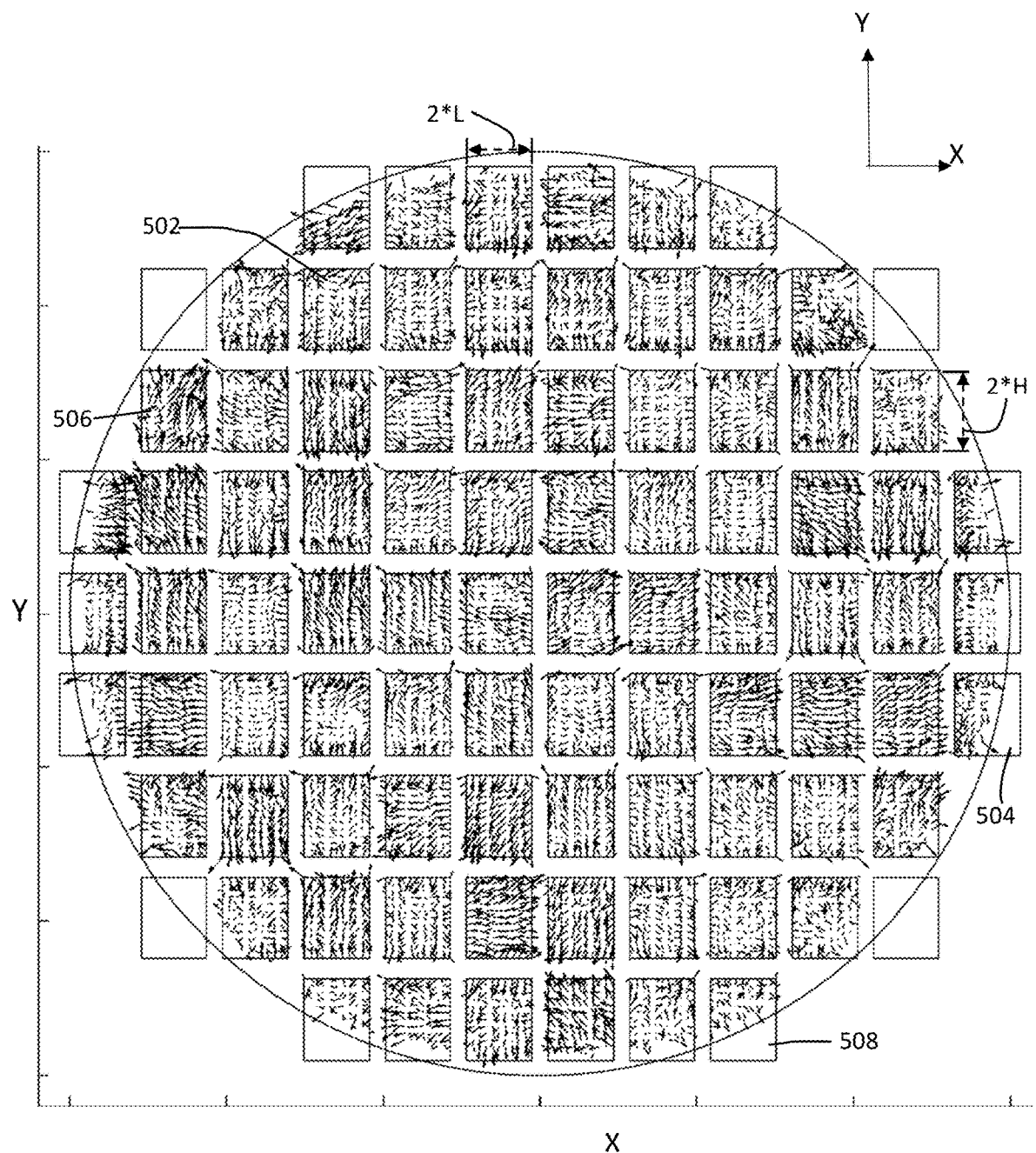
FIG. 5 is a chart showing a visual representation of overlay deviation measurements obtained for a substrate using an overlay metrology system in accordance with an example embodiment.

FIG. 5 is a chart showing a visual representation of all the overlay deviation measurements obtained for a substrate using an overlay metrology system. Because each overlay deviation measurement includes an X dimension component and a Y dimension component, the amount of overlay deviation for a particular point can be represented by a vector having a magnitude and direction in the X-Y plane. FIG. 5 shows a plurality of full fields 502 and plurality of partial fields 504. The number of full fields 502 and partial fields 504 depend on the size of the patterning portion of the template and the size of the substrate. For example, when the substrate has a 100 to 450 mm diameter and the mesa 110 of the template has a length L of 1 to 225 mm and a height H of 1 to 225 mm there are 1 to many thousands of total full fields 502 and 1 to many thousands of partial fields 504. The overlay deviation for each measured location in each full and partial field is illustrated as a vector 506 in FIG. 5. Thus, in the example embodiment having 143 points of overlay deviation measured for each full field, there are 143 vectors shown for each full field 502. For the partial fields, the number of points of overlay deviation vary depending on how much of the partial field is on the substrate. Thus, as shown in FIG. 5, the number of vectors representing the amount of overlay deviation are greater on those partial fields that have more area on the substrate. As also shown in FIG. 5, for the partial fields that have very little area on the substrate (e.g., where 25% or less of the partial field area is on the substrate), there are no overlay measurements recorded and thus there are no vectors appearing on those partial fields. In summary, FIG. 5 provides a visual representation of the overlay deviation as measured using the overlay metrology system for the entire substrate 102.

As noted above, the underlying data for each vector 506 illustrated in FIG. 5 is a deviation amount in the X dimension, i.e., Δx and a deviation amount in the Y dimension, i.e., Δy as measured by the overlay metrology system. While the measured overlay deviation for one particular substrate is shown in FIG. 5, overlay deviation for multiple substrates can be measured, for example 2 to 100s of substrates. The underlying data may be averaged across all of the full fields of one substrate or averaged across all of the full fields of all of the substrates in order to obtain a set of data points that represent the average deviation of all the full field measured points across the one substrate and/or across multiple substrates. The measured overlay deviation for the partial fields cannot be averaged across other partial fields within the same substrate because, as noted above, the number of data points varies in each partial field. However, when averaging measured overlay deviation across multiple substrates, corresponding partial fields across the multiple substrates can be averaged (e.g., the partial field 508 appearing at the last row of the last column can be averaged with the corresponding partial field located at the last row and last column of all the other substrates).

The obtained average Δx values and average Δy values for each measured overlay deviation data point may be considered information regarding in-plane distortion of the substrate. That is, in one example embodiment, the step S402 of receiving information regarding in-plane distortion of the substrate is receiving the average Δx and average Δy value for each measured overlay deviation data point. The distortion represented by the average Δx and average Δy value for each measured overlay deviation data point is considered "in-plane" distortion because it occurs in the X-Y plane. As noted above, the steps of actually determining the average Δx and average Δy value for each measured overlay deviation data point may also be considered part of the overall nanofabrication method in an embodiment. In another embodiment, the individual Δx values and Δy values (i.e., without any averaging) for each measured overlay deviation data point may be considered the information regarding in-plane distortion. In the case of not using averaged data, the method described herein would be repeated for every individual field. Similarly, because partial fields are not necessarily averaged within one substrate, when the information regarding in-plane distortion is for partial fields, the method described herein is performed for each individual partial field if being applied to a single substrate. In another embodiment, when overlay data is being acquired from multiple substrates, the information regarding in-plane distortion for corresponding partial fields across multiple substrates can be averaged. In summary, the data obtained in step S402 can be any one or combination of 1) measured overlay deviation of average Δx values and average Δy values of full fields, where the data set is the average of all the full fields of one substrate 2) measured overlay deviation in terms of average Δx values and average Δy values of full fields, where the data set is the average of all the full fields of many substrates, 3) measured overlay deviation in terms of average Δx values and average Δy values of partial fields, where the data set is the average of corresponding partial fields of many substrates (but not the average of data of partial fields within the same substrate), 4) measured overlay deviation in terms of Δx values and Δy, where the data set is for each individual full field without any averaging, 5) measured overlay deviation in terms of Δx values and Δy values for each individual partial field, without any averaging. In an alternative embodiment, a set of overlay deviation data points at a plurality of positions for each individual field (full and partial) are averaged across multiple substrates to produce a set of averaged overlay deviation data points at a plurality of positions for each field this can be used to describe overlay errors that are due to positions of the imprint field such as those which might be induced by the substrate chuck.

Figure 6:
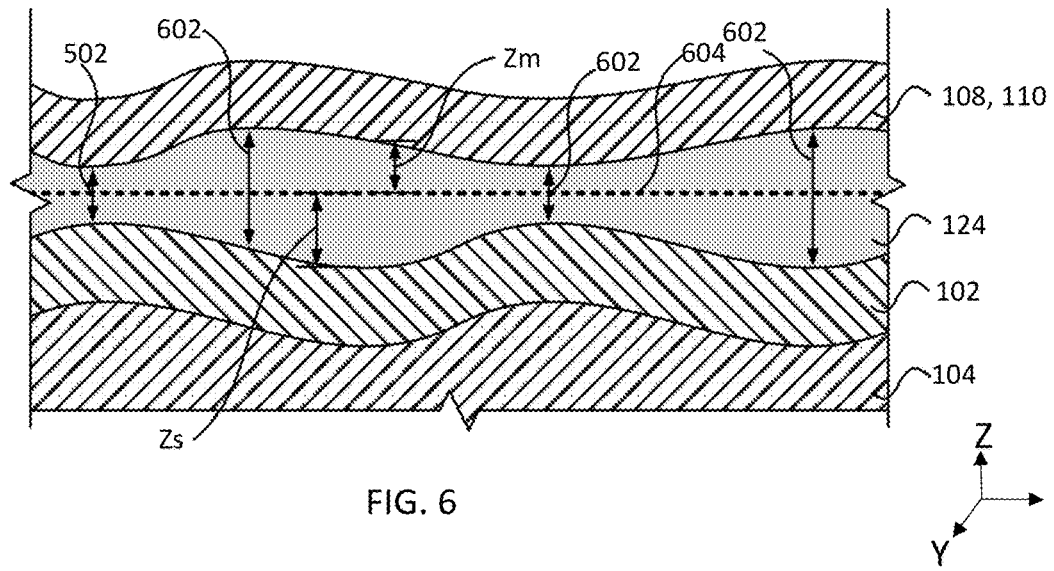
FIG. 6 shows a schematic cross section of a mesa of a template in contact with formable material in accordance with an example embodiment.

The method may then proceed to step S404 where target out-of-plane displacement of the mesa 110 of the template 102 is modeled based on the received information regarding the in-plane distortion from step S402. The target out-of-plane displacement of the mesa 110 of the template refers to the desired displacement (i.e., bending) of the mesa 110 in the Z dimension relative to a reference point in the Z dimension. In particular, the target out-of-plane displacement of the template is the desired out-of-plane bending of the mesa that substantially mirrors (i.e., is a substantial mirror image of) the existing out-of-plane bending of the substrate. FIG. 6 shows a schematic cross section where the mesa 110 of the template 108 is in contact with formable material 124. FIG. 6 shows the final result of implementing the method disclosed herein, such that after the template 108 comes into contact with dispensed formable material 124, the template 108 (more particularly, the mesa 110) bends such that the out-of-plane displacement of the mesa 110 substantially mirrors the out-of-plane displacement of the substrate 102. The mirroring of the displacement is illustrated by the displacement arrows 602. At the moment shown in FIG. 7, the formable material 124 has already been dispensed on the substrate 102 according to a particular drop pattern. That is, the formable material 124 is dispensed onto the substrate using a particular drop pattern that causes the desired out-of-plane-displacement of the mesa 110 that substantially mirrors the out-of-plane displacement of the substrate 102. Precisely mirroring would mean that, at every x,y location, a Z dimension distance (Zm) between an X dimension centerline 704 passing through a center of the formable material 124 and the bottom surface of the bent mesa is equal to a Z dimension distance (Zs) between the X dimension centerline 604 and an upper surface of the substrate 102. Substantially mirroring means that, at a majority of x,y locations (e.g., 50% or more of x,y locations, 60% or more of x,y locations, 70% or more of x,y locations, 80% or more of x,y locations, 90% or more of x,y locations, 95% or more of x,y locations, 99% or more of x,y locations, 99.5% or more of x,y locations, 99.9% or more of x,y locations, or 100% of x,y locations), Zm is within 10% of Zs. This process of dispensing the formable material to induce the bending in the mesa is described in more detail below, but it should be understood that in step S404, the target or desired bending in the mesa is being modeled, where the target/desired bending is a profile that substantially mirrors (i.e., corresponds to) the existing bending in the substrate after contacting the dispensed formable material.

Figure 7:
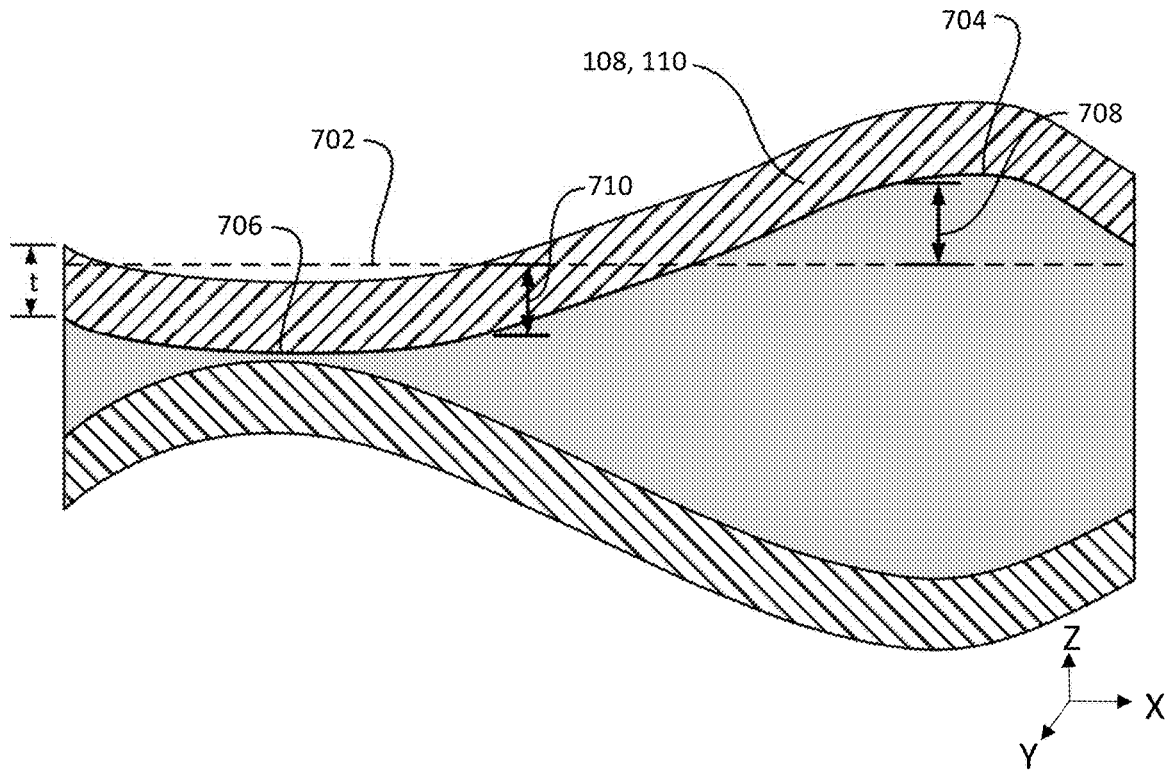
FIG. 7 shows a schematic cross section view of a mesa of a template in contact with formable material in accordance with an example embodiment.

FIG. 7 shows a schematic cross section view of a portion of the template (mesa) after it has become bent. As seen in FIG. 7, the mesa 110 has a thickness t and a reference line 702. The thickness t of the mesa 110 is constant and the reference line 702 is a horizontal line passing through the midpoint in the Z dimension between the highest Z dimension location 704 and the lowest Z dimension location 706 of the bent patterning surface 112. The distance from line 802 in the Z dimension at a particular x and y coordinate is a numeric representation of the relative amount of out-of-plane displacement at that particular location, which is referred to herein as z(x,y). While line 702 is shown as a line extending in the X dimension in the cross section view of FIG. 7, the same line would also appear in the Y dimension if the cross section were taken perpendicular to the view seen in FIG. 7. In other words, because every z value is located at an x and y coordinate, the reference point for the z values may be considered an X-Y plane. A z value that is negative would be the distance below the reference line/plane and a positive z value would be the distance above the reference line/plane. FIG. 7 shows one example z distance 708 that is positive and another example z distance 710 that is negative.

As noted above, the Δx values (or average Δx values) and Δy values (or average Δy values) at a plurality of points in the X-Y plane (i.e., the in-plane distortion of the substrate) has already been received in step S402. These values can be used to calculate z(x,y), i.e., the target out-of-plane displacement z of the template (mesa) at a particular x,y coordinate, which can be performed for any or all of the above-noted types of in-plane distortion information. The out-of-plane displacement of the template may be modeled using the following equation 1:

$$z(x, y) = \sum_{m,n=0}^{m,n=p} \frac{1}{E_{m,n}} [(a_{m,n}F_1(x, y)) + (b_{m,n}F_2(x, y)) + (c_{m,n}F_3(x, y)) + (d_{m,n}F_4(x, y))]$$

Equation 1

In equation 1:
a, b, c, d are Fourier coefficients,
$F_1, F_2, F_3,$ and $F_4$ are 2D Fourier basis functions, $$F_1(x, y) = \cos\frac{n\pi x}{L}\sin\frac{m\pi y}{H},$$

$$F_2(x, y) = \cos\frac{n\pi x}{L}\cos\frac{m\pi y}{H},$$

$$F_3(x, y) = \sin\frac{n\pi x}{L}\sin\frac{m\pi y}{H},$$

$$F_4(x, y) = \sin\frac{n\pi x}{L}\cos\frac{m\pi y}{H},$$

m and n are integers representing geometric modes,
p is an integer greater than 0, preferably 1 to 6, more preferably 1 to 3,
L is half the width of the imprint field, which is also half the width of the mesa in the X dimension,
H is half the height of the imprint field, which is also half the height of the mesa in the Y dimension,
x is a value representing a location in the X dimension,
y is a value representing a location in the Y dimension,
z(x,y) is a value representing a distance in the Z dimension from the reference line/plane 802 that is at the midpoint between the highest z(x,y) value and the lowest z(x,y) value, $E_{m,n}$ is a correction coefficient, unique to a particular m,n geometric mode.

As seen in equation 1, the target out-of-plane displacement of template is modeled as a summation of a plurality of geometric modes, where each geometric mode is represented by a linear combination of basis functions in two dimensions. As noted above, m and n are integers representing the geometric modes. That is, each geometric mode is defined by an m value and an n value. Some example geometric modes are 1,1; 2,2; 3,3; 4,4; 5,5; 6,6, where the format for each mode is "m,n". As seen in equation 1, in the example embodiment, the basis functions that define each m,n mode are sine or cosine functions, i.e., a Fourier series. However, other functions known in the art may be used. In equation 3, there are a linear combination of four basis functions, $F_1, F_2, F_3,$ and $F_4$, as shown above.

For each of the four basis functions in each m,n geometric mode, a Fourier coefficient is calculated. As noted above, in equation 1, a, b, c, and d represent the Fourier coefficient. Each of a, b, c, and d has the subscript m,n in equation 1 to represent that the Fourier coefficients are unique to the particular geometric mode. Thus, for example for geometric mode 1,1, the portion of equation 1 relating to the linear combination of basis functions becomes:

$$\left(a_{1,1}\cos\left(\frac{1\pi x}{L}\right)\sin\left(\frac{1\pi y}{H}\right)\right) + \left(b_{1,1}\cos\left(\frac{1\pi x}{L}\right)\cos\left(\frac{1\pi y}{H}\right)\right) + \left(c_{1,1}\sin\left(\frac{1\pi x}{L}\right)\sin\left(\frac{1\pi y}{H}\right)\right) + \left(d_{1,1}\sin\left(\frac{1\pi x}{L}\right)\cos\left(\frac{1\pi y}{H}\right)\right)$$

The Fourier coefficients may be calculated using the information regarding in-plane distortion of the substrate from step S402 using the following equation (2):

$$[A_{0,0} \ldots A_{m,n} \ldots A_{p,p}]g - B = 0$$

Equation 2 where $A_{m,n}$ is represented by the following equation (3):

$$A_{m,n} = \frac{t}{2}\begin{bmatrix} \left(\frac{\partial F_1(x_1, y_1)}{\partial x}\right)_{m,n} & \left(\frac{\partial F_2(x_1, y_1)}{\partial x}\right)_{m,n} & \left(\frac{\partial F_3(x_1, y_1)}{\partial x}\right)_{m,n} & \left(\frac{\partial F_4(x_1, y_1)}{\partial x}\right)_{m,n} \\ \left(\frac{\partial F_1(x_1, y_1)}{\partial y}\right)_{m,n} & \left(\frac{\partial F_2(x_1, y_1)}{\partial y}\right)_{m,n} & \left(\frac{\partial F_3(x_1, y_1)}{\partial y}\right)_{m,n} & \left(\frac{\partial F_4(x_1, y_1)}{\partial y}\right)_{m,n} \\ & & \vdots & \\ \left(\frac{\partial F_1(x_k, y_k)}{\partial x}\right)_{m,n} & \left(\frac{\partial F_2(x_k, y_k)}{\partial x}\right)_{m,n} & \left(\frac{\partial F_3(x_k, y_k)}{\partial x}\right)_{m,n} & \left(\frac{\partial F_4(x_k, y_k)}{\partial x}\right)_{m,n} \\ \left(\frac{\partial F_1(x_k, y_k)}{\partial y}\right)_{m,n} & \left(\frac{\partial F_2(x_k, y_k)}{\partial y}\right)_{m,n} & \left(\frac{\partial F_3(x_1, y_1)}{\partial y}\right)_{m,n} & \left(\frac{\partial F_4(x_k, y_k)}{\partial y}\right)_{m,n} \end{bmatrix}$$

Equation 3

$A_{0,0}$ is a specific case of $A_{m,n}$ where m is 0 and n and 0 in equation (3), and $A_{p,p}$ is a specific case where m is p and n is p in equation (3), with p representing the final geometric mode as in equation (1).

B is represented by the following equation (4):

$$B = \begin{bmatrix} \Delta x(x_1, y_1) \\ \Delta y(x_1, y_1) \\ \vdots \\ \Delta x(x_k, y_k) \\ \Delta y(x_k, y_k) \end{bmatrix}$$

Equation (4)

In equation (3), t is the thickness of the mesa and m,n has the same meaning as in equation (1), $x_1$ represents a particular x coordinate, $y_1$ represented a particular y coordinate, $x_k$ represents the final x coordinate and $y_k$ represents the final y coordinate. As seen above, $A_{m,n}$ is a matrix composed of the partial derivate of each of the basis functions $F_1$ to $F_4$ for a particular m,n geometric mode across all of the x,y coordinates. Thus, $A_{m,n}$, is a matrix having 2*k rows and four columns. Ultimately, the matrix $[A_{0,0} \ldots A_{m,n} \ldots A_{p,p}]$ includes values for all of the geometric modes up to p for all of the x,y coordinates, where p is the number of geometric modes (e.g., if p is 3, then final geometric mode is 3,3). Thus, the number of rows in the matrix $[A_{0,0} \ldots A_{m,n} \ldots A_{p,p}]$ is 2*k and the number of columns is 4*(p+1)*(p+1).

In equation (4), $x_1$, $y_1$, $x_k$, $y_k$ have the same meaning as Equation (3). $\Delta x(x_1,y_1)$ means the $\Delta x$ (averaged or not averaged) overlay deviation at the $x_1$, $y_1$ coordinate as received in step S402. Similarly, $\Delta y(x_1,y_1)$ means the $\Delta y$ (averaged or not averaged) overlay deviation at the $x_1$, $y_1$ coordinate as received in step S402. As seen above, B is a vector including all of the measured overlay deviation for every x,y coordinate that has been received in step S402. Thus, B is a vector (one column) with 2*k rows.

With all of the terms in equation (2) known other than g, one can solve for g. Solving for g will provide a vector containing all of the a, b, c, and, d Fourier coefficients for all of the modes up to p. Thus, g will be one column with 4*(p+1)*(p+1) rows. For example, g can be represented by the following equation (5):

$$g = \begin{bmatrix} a_{0,0} \\ b_{0,0} \\ c_{0,0} \\ d_{0,0} \\ \vdots \\ a_{p,p} \\ b_{p,p} \\ c_{p,p} \\ d_{p,p} \end{bmatrix} \quad \text{Equation (5)}$$

where the first for terms $a_{0,0}$, $b_{0,0}$, $c_{0,0}$, and $d_{0,0}$ are the four Fourier coefficients for geometric mode 0,0 and the final terms $a_{p,p}$, $b_{p,p}$, $c_{p,p}$ and $d_{p,p}$ are the four Fourier coefficients for the final geometric mode p,p (e.g., when p is 3, then the final set of Fourier coefficients is $a_{3,3}$; $b_{3,3}$; $c_{3,3}$; $d_{3,3}$). In summary the overlay deviation information (i.e., information regarding in-plane distortion of a substrate) obtained in step S402 is used to find the Fourier coefficients for all of the geometric modes.

Returning to equation 1, another aspect of the equation is the correction coefficient "$E_{m,n}$". E has the subscript "m,n" because each m,n geometric mode has a unique correction coefficient that is specific to the particular imprinting system being used to perform the imprinting method. The correction coefficient $E_{m,n}$ is a coefficient of $B_{empirical,m,n}/B_{analytical,m,n}$ (i.e., $E_{m,n}=B_{empirical,m,n}/B_{analytical,m,n}$), where $B_{empirical,m,n}$ is an empirically determined amount of out-of-plane displacement caused to the template when the template is contacted with formable material dispensed according to a drop pattern based on the particular geometric mode, and where $B_{analytical,m,n}$ is an analytically determined amount of out-of-plane displacement caused to the template when the template is contacted with formable material dispensed according to a drop pattern based on the same particular geometric mode. In other words, empirically determined means determining distortion by actually dispensing a drop pattern and measuring the distortion, while analytically determined means determining distortion based on modeling. The analytical determination is explained below in more detail.

For each geometric mode m,n, the empirical amount of out-of-plane displacement is determined by generating a drop pattern that is based on equation 1, but with the correction coefficient term omitted, and with the Fourier coefficients a, b, c, and d set to following values: $c_{m,n}=1$ and $a_{m,n}=b_{m,n}=d_{m,n}=0$. These values are chosen for a, b, c, and d because the correction coefficient is independent of the phases of individual geometric modes and the relative amplitude of the two orthogonal (X-direction, Y-direction) modes. However, other values of the Fourier coefficients can be selected as the Fourier basis functions are independent and orthogonal to each other. Thus, equation 1 becomes the following equation 6:

$$zmode_{m,n}(x, y) = 1\sin\left(\frac{n\pi x}{L}\right)\sin\left(\frac{m\pi y}{H}\right) \quad \text{Equation 6}$$

For example, in the case of the geometric mode 1×1, Equation 6 becomes:

$$zmode_{1,1}(x, y) = 1\sin\left(\frac{1\pi x}{L}\right)\sin\left(\frac{1\pi y}{H}\right)$$

Figure 8A:
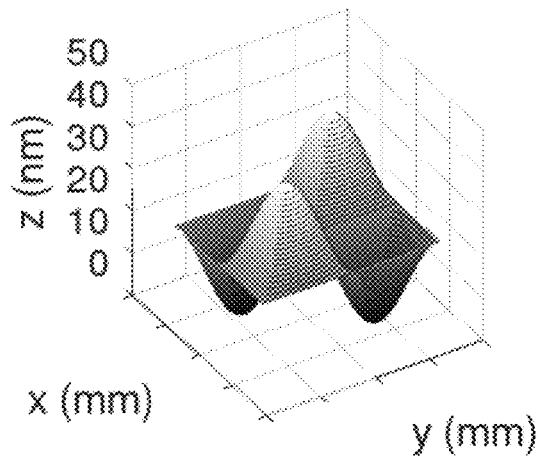
FIGS. 8A to 8F show three dimensional graphs of various geometric modes in accordance with an example embodiment.
Figure 8B:
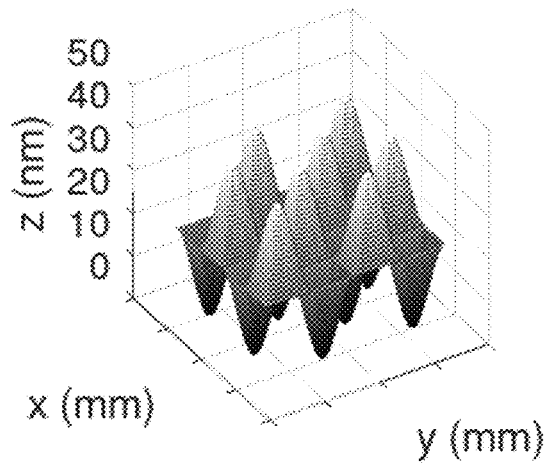
Figure 8C:
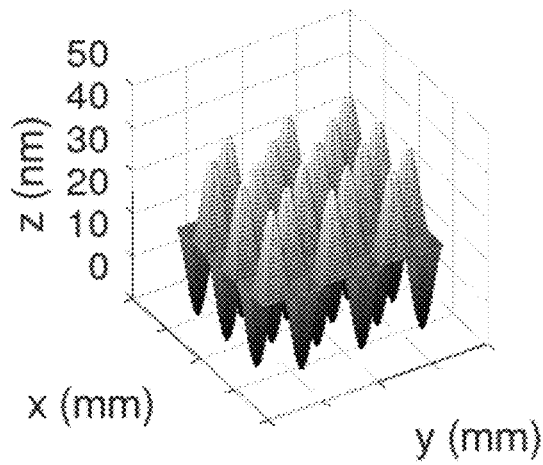
Figure 8D:
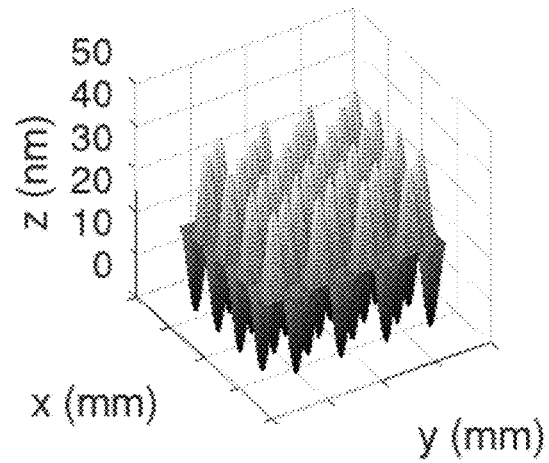
Figure 8E:
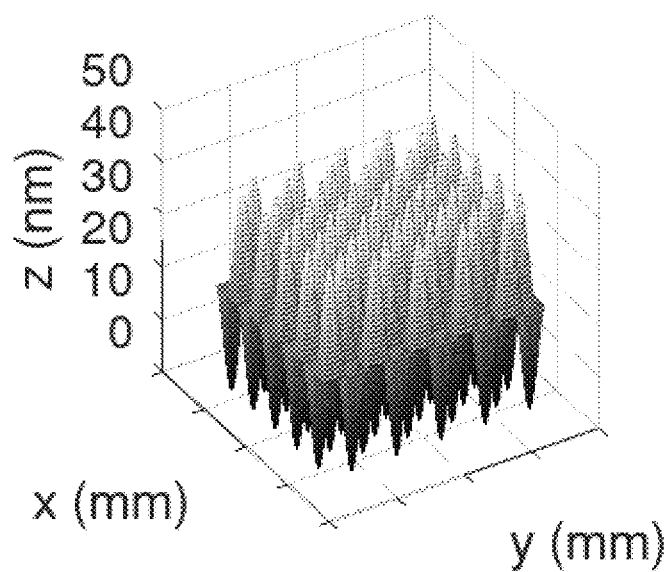
Figure 8F:
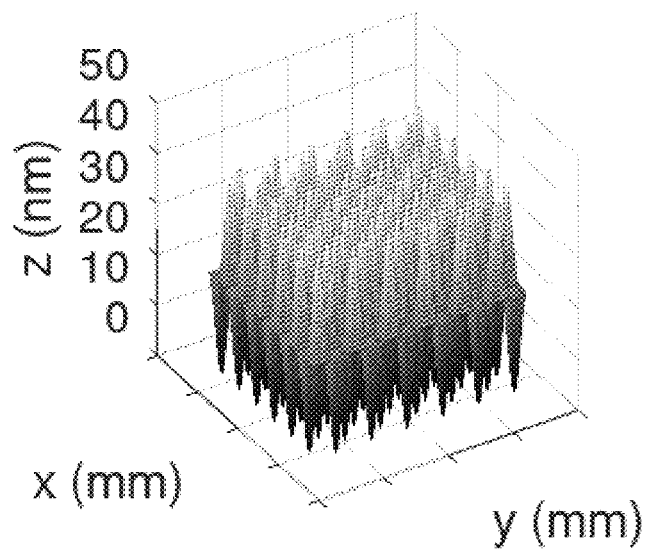

Equation 6 provides z values as a function of x and y for each geometric mode. FIG. 8A shows a three dimensional graph of equation 6 for geometric mode 1,1 in the X, Y, and Z axes. That is, FIG. 8A is graphical representation of the Z values for each particular x,y coordinate for equation 6 when m and n are both 1. FIG. 8B shows a three dimensional graph of equation 6 for geometric mode 2,2. FIG. 8C shows a three dimensional graph of equation 6 for geometric mode 3,3. FIG. 8D shows a three dimensional graph of equation 6 for geometric mode 4,4. FIG. 8E shows a three dimensional graph of equation 6 for geometric mode 5,5. FIG. 8F shows a three dimensional graph of equation 6 for geometric mode 6,6. Accordingly, for each mode equation 6 provides a z ($zmode_{m,n}$) value for any particular x,y coordinate.

Equation 6, for each particular geometric mode ($zmode_{m,n}$), can then be used to determine $\Delta x$ and $\Delta y$ using the same equations 2 to 5 above. The process of solving for $\Delta x$ and $\Delta y$ for a particular geometric mode n,m is essentially the reverse the process of solving for x above. In this case, the equation (2) becomes:

$$A_{m,n}g_0 - B_{analytical,m,n} = 0$$

$$B_{analytical,m,n} = A_{m,n}g_0$$

where the x matrix containing the Fourier coefficients is known because, as noted above, the Fourier coefficients for a particular geometric mode is set as follows: $c_{m,n}=1$ and $a_{m,n}=b_{m,n}=d_{m,n}=0$. Thus, x becomes:

$$g_0 = \begin{bmatrix} 0 \\ 0 \\ 1 \\ 0 \\ \vdots \\ 0 \\ 0 \\ 1 \\ 0 \end{bmatrix}$$

Because $a_{m,n}=b_{m,n}=d_{m,n}=0$, the functions $F_1$, $F_2$, and $F_4$ are also 0 in the matrix $A_{m,n}$. Thus, $A_{m,n}$ becomes:

$$A_{m,n} = \frac{t}{2}\begin{bmatrix} 0 & 0 & \left(\frac{\partial F_3(x_1, y_1)}{\partial x}\right)_{m,n} & 0 \\ 0 & 0 & \left(\frac{\partial F_3(x_1, y_1)}{\partial y}\right)_{m,n} & 0 \\ & & \vdots & \\ 0 & 0 & \left(\frac{\partial F_3(x_k, y_k)}{\partial x}\right)_{m,n} & 0 \\ 0 & 0 & \left(\frac{\partial F_3(x_1, y_1)}{\partial y}\right)_{m,n} & 0 \end{bmatrix}$$

By then solving for the vector B, the Δx and Δy, values can be determined for each of the same x,y coordinate points that were measured using the overlay metrology system. In other words, the vectors for each of the same coordinates in the imprint field are calculated based on equations 2-5 for each geometric mode. Thus, by solving for Δx and Δy based on equations 2-5, overlay deviation is analytically determined for all of the same corresponding locations in the imprint field.

Figures 9A, 9B:
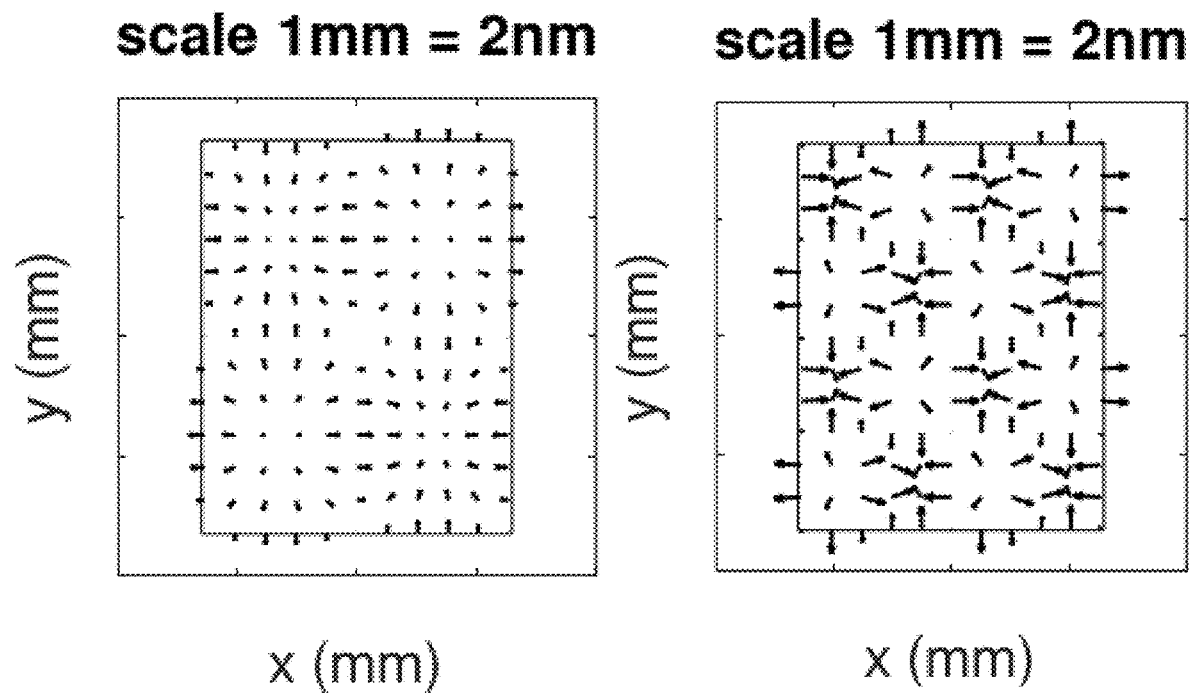
FIGS. 9A to 9F show two dimensional graphs of empirically determined overlay deviation for various mode drop pattern generated from various geometric modes.
Figures 9C, 9D:
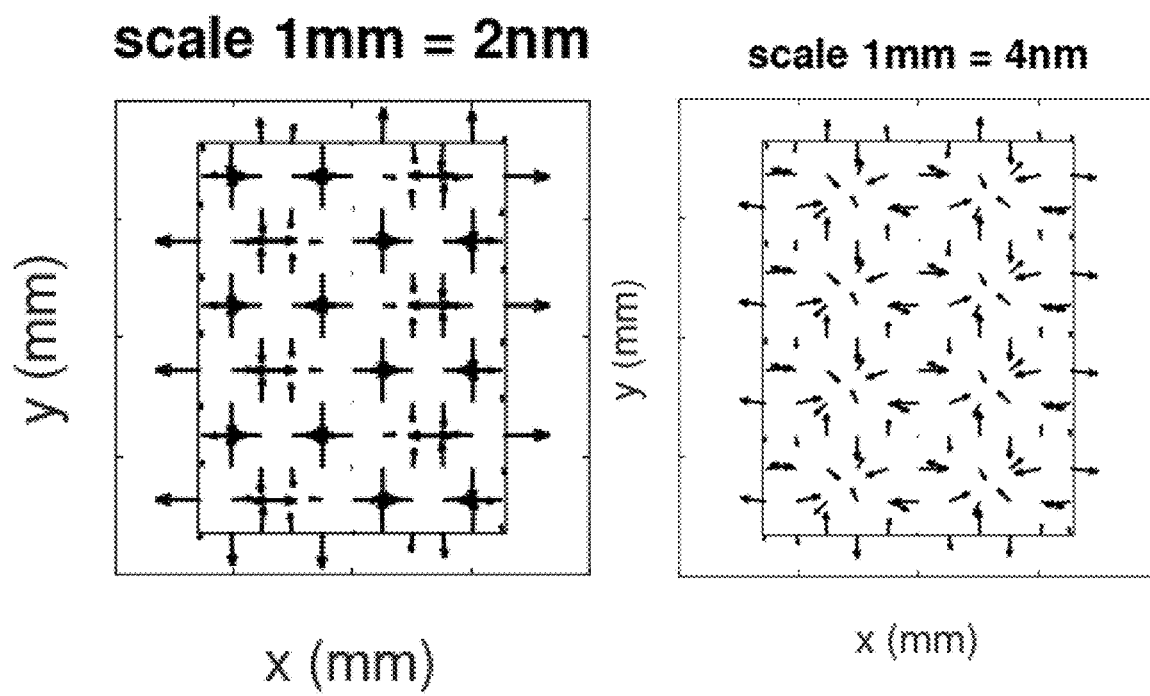
Figure 9E:
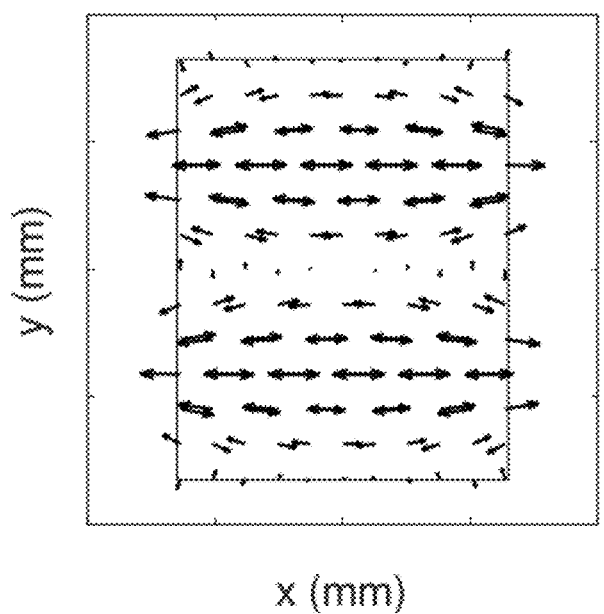
Figure 9F:
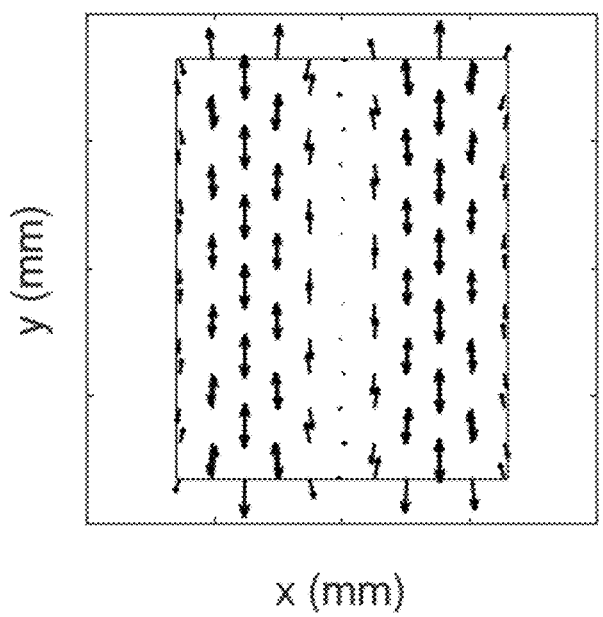

FIG. 9A shows a two dimensional graph of analytically determined overlay deviation for a mode drop pattern generated from geometric mode 1,1, i.e., the calculated Δx and Δy based on equation 6 for geometric mode 1,1. The graph of FIG. 9A represents the overlay deviation as vectors for each of the same x,y coordinates as measured by the overlay measuring device. Thus, FIG. 9A shows the empirically determined expected overlay deviation if a drop pattern that has been generated based on equation 6 for geometric mode 1,1 were dispensed and then contacted with a template. FIG. 9B shows a two dimensional graph of empirically determined overlay deviation for a mode drop pattern generated from geometric mode 2,2. FIG. 9C shows a two dimensional graph of empirically determined overlay deviation for a mode drop pattern generated from geometric mode 3,3. FIG. 10D shows a two dimensional graph of empirically determined overlay deviation for a mode drop pattern generated from geometric mode 4,4. FIG. 10E shows a two dimensional graph of empirically determined overlay deviation for a mode drop pattern generated from geometric mode 5,5. FIG. 10F shows a two dimensional graph of empirically determined overlay deviation for a mode drop pattern generated from geometric mode 6,6.

The empirically determined data, being based on the above-described modeling, does not take into account aspects of the imprint system that may cause the actual overlay deviation to be different from what is predicted by the empirical modeling. For example, the particular formable material being used and the particular imprint process conditions such as imprint force, substrate holding vacuum, back-pressure on template, tip-tilt adjustment may have an effect on the overlay deviation when the mode drop pattern for a particular geometric mode is dispensed and contacted with the template. Thus, the correction coefficient accounts for these factors by providing a value that represents how close the empirical overlay deviation is to the actual overlay deviation. The analytically determined amount of out-of-plane displacement is the actual displacement caused to the template when the template is contacted with formable material dispensed according to a drop pattern based on the same particular geometric mode.

A drop pattern, referred herein as a mode drop pattern, may be generated based off equation 6 for each particular geometric mode. The mode drop pattern is a drop pattern generated from the z values (zmode) for the particular x,y coordinates of a particular geometric mode. The mode drop pattern can be generated using drop pattern generation methods known in the art, i.e., as described in the '962 patent. Other references that discuss how to generate drop patterns can be found at U.S. Pat. No. 8,119,052 which is hereby incorporated by reference. A mode drop pattern may be prepared for each of the geometric modes, e.g., geometric modes 1,1; 2,2; 3,3; 4,4; 5,5; 6;6. A particular mode drop pattern may then be dispensed and imprinted using the template according to the method 300 of FIG. 3. After the imprinting has been performed for a particular geometric mode using the mode drop pattern generated for that particular mode, the overlay deviation can be measured using the overlay metrology system. The overlay metrology system is used to measure the overlay deviation in the same manner as discussed above. As above, the measured values provide a Δx and Δy for each of the same locations in the X-Y plane as in the other measurements. These measured values of overlay deviation after dispensing the mode drop pattern for a particular geometric mode is the empirically determined in-plane distortion.

Figure 10A:
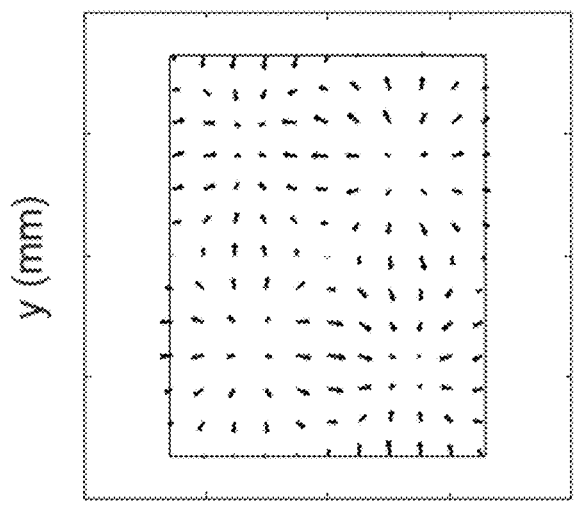
FIGS. 10A to 10I show two dimensional graphs of analytically determined overlay deviation (in-plane distortion) for various mode drop patterns generated from various geometric modes.
Figure 10B:
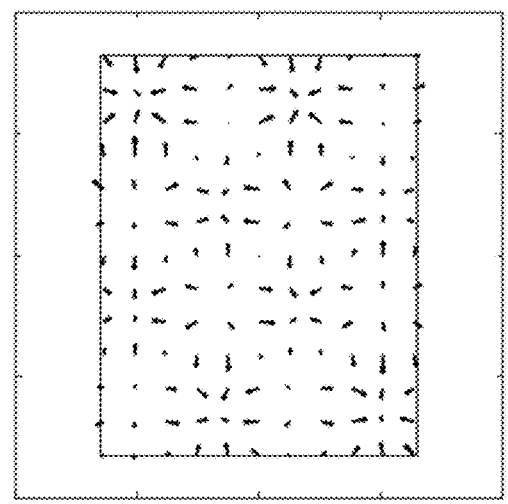
Figure 10C:
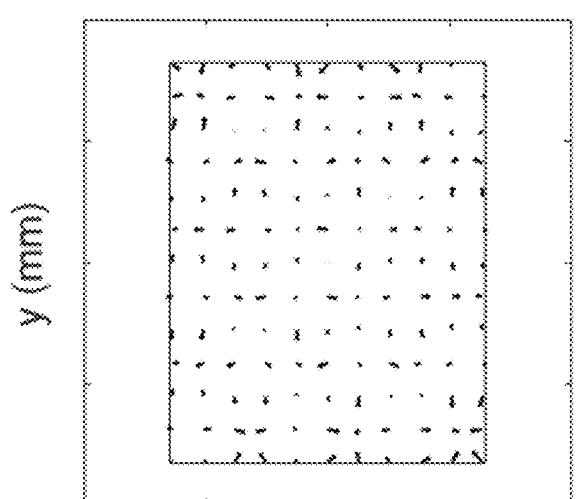
Figure 10D:
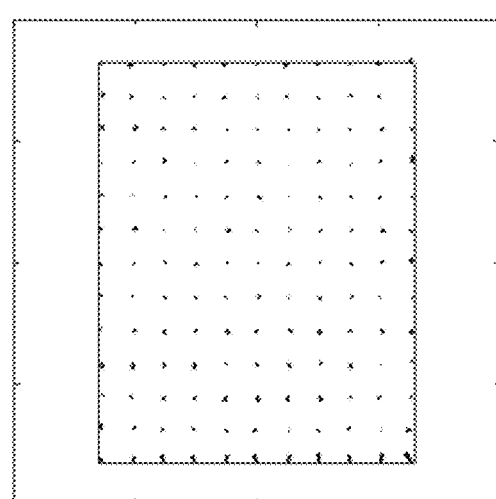
Figure 10E:
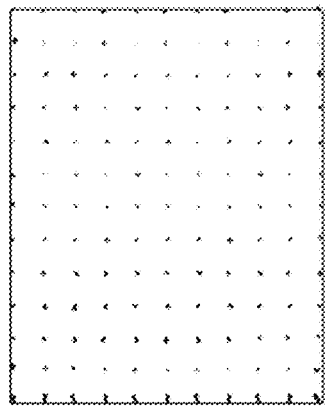
Figure 10F:
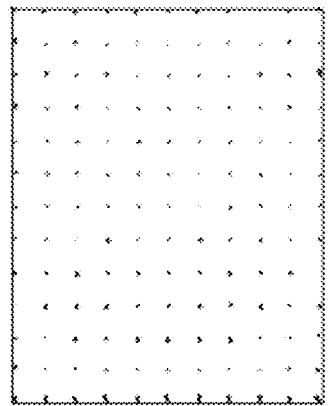
Figure 10G:
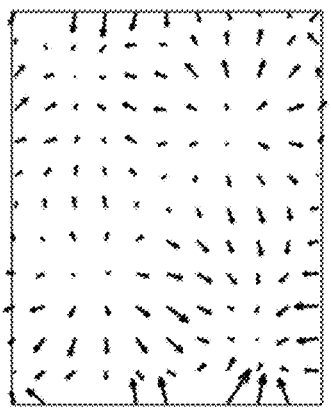
Figure 10H:
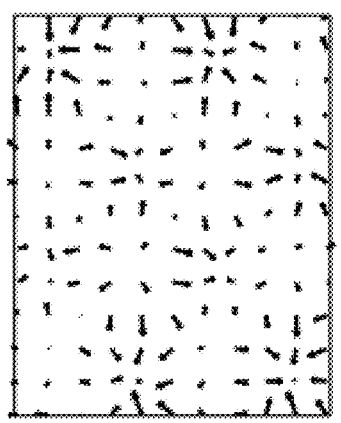
Figure 10I:
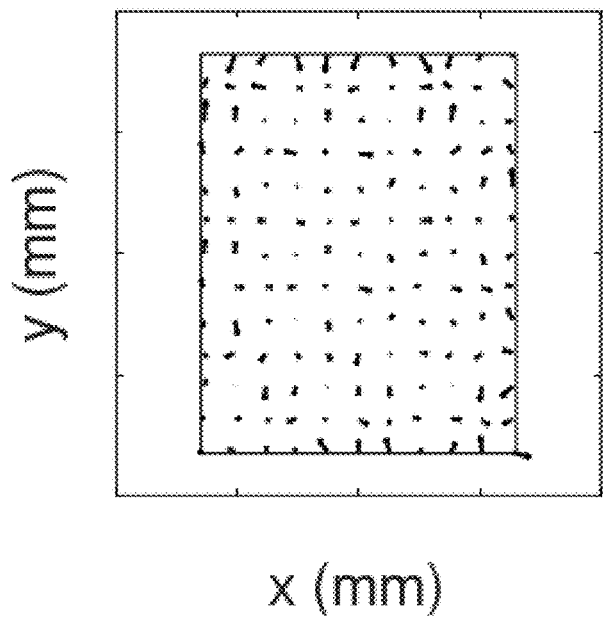

FIG. 10A shows a two dimensional graph of empirically determined overlay deviation (in-plane distortion) for a mode drop pattern generated from geometric mode 1,1, i.e., the measured Δx and Δy after dispensing the mode drop pattern generated from equation 6 for geometric mode 1,1. Similar to FIG. 9A, the graph of FIG. 10A represents the overlay deviation as vectors for each of the same x,y coordinates as measured by the overlay measuring device. Thus, FIG. 10A shows the empirically determined actual overlay deviation when a mode drop pattern that has been generated based on equation 6 for geometric mode 1,1 is actually dispensed and then contacted with a template. FIG. 1013 shows a two dimensional graph of empirically determined overlay deviation (in-plane distortion) for a mode drop pattern generated from geometric mode 2,2 that was dispensed and then contacted with a template. FIG. 10C shows a two dimensional graph of empirically determined overlay deviation (in-plane distortion) for a mode drop pattern generated from geometric mode 3,3 that was dispensed and then contacted with a template. FIG. 10D shows a two dimensional graph of empirically determined overlay deviation (in-plane distortion) for a mode drop pattern generated from geometric mode 4,4 that was dispensed and then contacted with a template. FIG. 10E shows a two dimensional graph of empirically determined overlay deviation (in-plane distortion) for a mode drop pattern generated from geometric mode 5,5 that was dispensed and then contacted with a template. FIG. 10F shows a two dimensional graph of analytically determined overlay deviation (in-plane distortion) for a mode drop pattern generated from geometric mode 6,6 that was dispensed and then contacted with a template. FIG. 10G shows a two dimensional graph of empirically determined overlay deviation (in-plane distortion) for a mode drop pattern generated from geometric mode 1,1, i.e., the measured Δx and Δy after dispensing the mode drop pattern generated from equation 6 for geometric mode 1,1 on a partial field. FIG. 10H shows a two dimensional graph of empirically determined overlay deviation (in-plane distortion) for a mode drop pattern generated from geometric mode 2,2, i.e., the measured Δx and Δy after dispensing the mode drop pattern generated from equation 6 for geometric mode 1,1 on a partial field. FIG. 10I shows a two dimensional graph of empirically determined overlay deviation (in-plane distortion) for a mode drop pattern generated from geometric mode 3,3, i.e., the measured $\Delta x$ and $\Delta y$ after dispensing the mode drop pattern generated from equation 6 for geometric mode 1,1 on a partial field. The two-dimensional graphs of the partial fields in FIGS. 10G-I are calculated by averaging several partial fields on a substrate to obtain an equivalent full field.

After empirically determining the overlay deviation (in-plane distortion) and analytically determining the overlay deviation (in-plane distortion) for a particular geometric mode, the correction coefficient $E_{mn}$ can then be calculated. The following equation (7) may be used to calculate $E_{mn}$:

$$E_{m,n} * B_{analytical,m,n} - B_{empirical,m,n} = 0 \qquad \text{Equation (7)}$$

$B_{analytical,m,n}$ is a vector containing all of the $\Delta x$ and $\Delta y$ overlay deviation values determined in the analytical manner discussed above for each particular geometric mode. $B_{empirical,m,n}$ is similarly a vector containing all of the $\Delta x$ and $\Delta y$ overlay deviation values that are measured after contacting the template with a drop pattern generated from the zmode values determined by equation (5) for each particular geometric mode. Equation (7) can then be solved for $E_{m,n}$ using a linear algebra solver known in the art such as the Matlab® or Octave functions lsqlin( ) or mldivide( ). This calculation can be repeated for every geometric mode, thereby resulting in a unique correction coefficient for each geometric mode.

Figure 11:
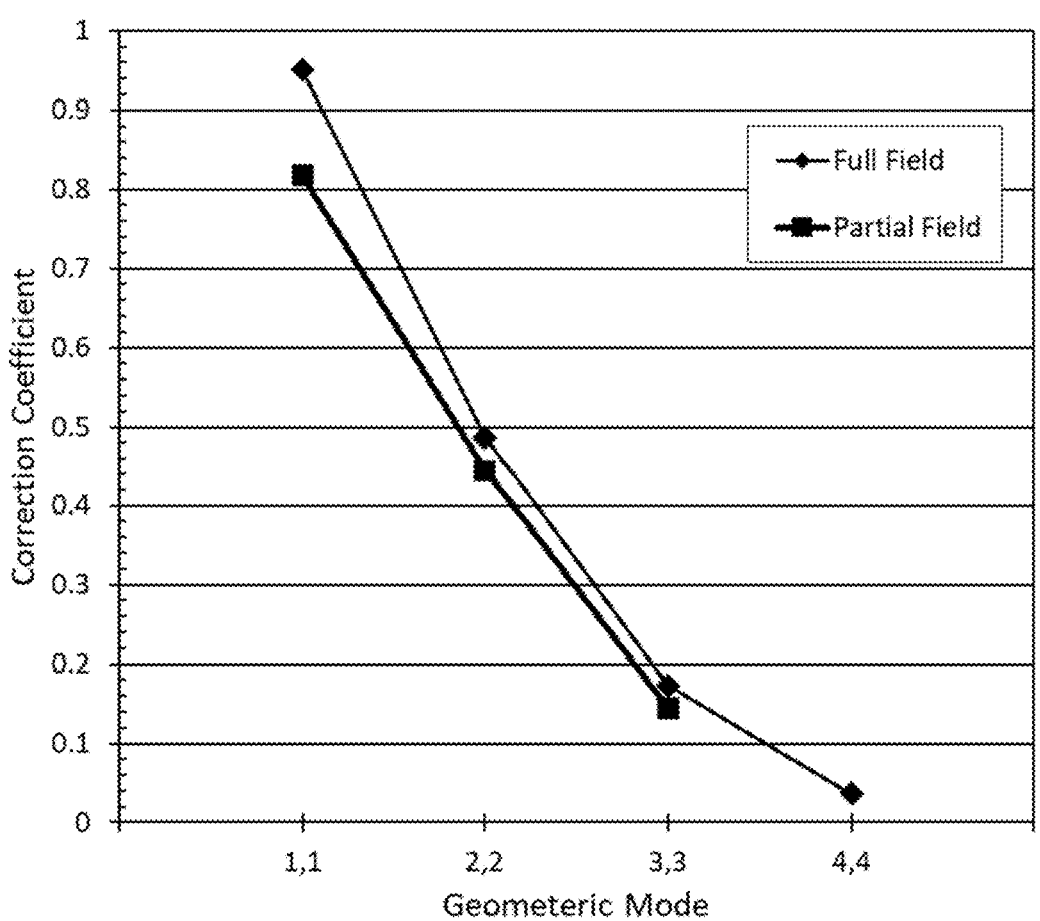
FIG. 11 shows a chart showing geometric modes on the x-axis and a correction coefficient on y-axis in accordance with an example embodiment.

FIG. 11 shows a chart showing geometric mode on the x-axis and the correction coefficient on y-axis in accordance with an example embodiment. The data points in FIG. 11 were acquired by performing the steps discussed above for six different geometric modes when applied to a full field (1,1; 2,2; 3,3; 4,4; 5,5; 6,6) and three different geometric modes when applied to a partial field (1,1; 2,2; 3,3) using the same template and formable material. The only difference between determining the correction coefficient for a full field and partial field is that for a partial field the drop pattern generated from the zmode equation 6 is formulated for a partial field and then the formable material is dispensed on the partial field and contacted with the template. In the case of a full field the drop pattern generated from the zmode equation 6 is formulated for a full field and then the formable material is dispensed on the full field and contacted with the template. The data points of FIG. 11 are also tabulated in the following Table 1:

TABLE 1

| Geometric Mode | Correction Coefficient |
| --- | --- |
| 1, 1 Full Field | 0.9511 |
| 2, 2 Full Field | 0.4866 |
| 3, 3 Full Field | 0.1732 |
| 4, ×4 Full Field | 0.0776 |
| 5, 5 Full Field | 0.0416 |
| 6, 6 Full Field | 0.0360 |
| 1, 1 Partial Field | 0.7037 |
| 2, 2 Partial Field | 0.4063 |
| 3, 3 Partial Field | 0.1211 |

As shown in FIG. 11, it was found that as m and n increase, the correction coefficient becomes closer and closer to 0. In particular, each of geometric modes 4,4; 5,5; and 6,6 were below 0.1. This indicates that the higher geometric modes significantly deviate from the predicted overlay deviation when a drop pattern is actually dispensed, as compared to the lower geometric modes. In an example embodiment, only geometric modes having a correction coefficient that is greater than 0.1 are used in equation 1, i.e., only geometric modes 3,3 and lower. Thus, in one embodiment, equation 1, in view of FIG. 11 would be as follows:

$$z(x,y) = \sum_{m,n=0}^{m,n=3} \frac{1}{E_{m,n}} \left( a_{m,n} \cos\left(\frac{n\pi x}{L}\right) \sin\left(\frac{m\pi y}{H}\right) \right) + \left( b_{m,n} \cos\left(\frac{n\pi x}{L}\right) \cos\left(\frac{m\pi y}{H}\right) \right) + \left( c_{m,n} \sin\left(\frac{n\pi x}{L}\right) \sin\left(\frac{m\pi y}{H}\right) \right) + \left( d_{m,n} \sin\left(\frac{n\pi x}{L}\right) \cos\left(\frac{m\pi y}{H}\right) \right)$$

That is, as shown in equation 6, the summation ends at geometric mode 3×3.

Additionally, while only the correction coefficients for geometric modes in which m=n, from 1 to 6, were determined in Table 1 and FIG. 11, the same data can be used to extrapolate the correction coefficients for other geometric modes without the need to dispense a drop pattern based on those geometric modes. These correction coefficients for the other geometric modes may be calculated by calculating the square root of two geometric modes according to the following equation (8):

$$E_{m,n} = \sqrt{E_{m,m} E_{n,n}} \qquad \text{Equation 8}$$

Tables 2 and 3 below illustrate an example of this calculation:

TABLE 2

| | Full Fields - $E_{m,n}$ each | | | | |
| --- | --- | --- | --- | --- | --- |
| | m = 0 | m = 1 | m = 2 | m = 3 | m = 4 |
| n = 0 | 1.0000 | 0.9752 | 0.6976 | 0.4162 | 0.1897 |
| n = 1 | 0.9752 | 0.9511 | 0.6803 | 0.4059 | 0.1850 |
| n = 2 | 0.6976 | 0.6803 | 0.4866 | 0.2903 | 0.1324 |
| n = 3 | 0.4162 | 0.4059 | 0.2903 | 0.1732 | 0.0790 |
| n = 4 | 0.1897 | 0.1850 | 0.1324 | 0.0790 | 0.0360 |

TABLE 3

| | Partial Fields | | | |
| --- | --- | --- | --- | --- |
| | m = 0 | m = 1 | m = 2 | m = 3 |
| n = 0 | 1.0000 | 0.8389 | 0.6374 | 0.3480 |
| n = 1 | 0.9752 | 0.8181 | 0.6216 | 0.3394 |
| n = 2 | 0.6976 | 0.5852 | 0.4446 | 0.2427 |
| n = 3 | 0.4162 | 0.3491 | 0.2653 | 0.1448 |

Tables 1 and 2 report the correction coefficient, which has been calculated using equation 7.

With the correction coefficients are determined as set forth above, all of the variables are known in equation 3. Thus, a model of target out-of-plane displacement is established where the z values of a particular x,y coordinate, i.e., z(x,y) is estimated. That is, the target out-of-plane displacement of the template that would match the out-of-plane displacement of the substrate has been modeled via equation 1 once all of $E_{m,n}$, a, b, c, and d, have been determined. As noted above, in a preferred embodiment the summation in equation 3 may be limited to m,n=0 to n,m=3. In another example embodiment, the summation in equation 3 can be limited to m,n=0 to m,n=4. In another example embodiment, the summation in equation 3 can be limited to m,n=0 to m,n=5. In another example embodiment, the summation in equation 3 can be limited to m,n=0 to m,n=6. In an alternative embodiment, values for correction coefficient $E_{m,n}$ are limited not by the upper limit p for the modes m,n but are instead limited by a correction threshold. Exemplary values for the correction threshold are 0.2 or 0.1 or another value that is experimentally determined based on the correction performance. When the correction coefficient $E_{m,n}$ is below a correction threshold then $1/E_{m,n}$ is set to zero.

With the modeling of the target out-of-plane displacement completed (i.e., step S404), the method may proceed to step S406. In step S406, a first drop pattern is generated based on the modeled out-of-plane displacement of the template. That is, using the same known techniques discussed above, a drop pattern is generated using the $z(x,y)$ values generated from completed equation 1. Depending on the particular data acquired in step S402 (e.g., average overlay deviation data, non-averaged overlay deviation data, full field, partial field), equation (1) may be used to obtain $z(x,y)$ values for full fields using full fields, then separately use equation (1) to obtain $z(x,y)$ values for partial fields. The $E_{m,n}$ term that is used would depend on whether the overlay deviation data was for a full field or a partial field. The drop pattern generated from the obtained $z(x,y)$ would thus be different for full fields and partial fields.

Next, the method may proceed to step S408 where a second drop pattern is generated by merging the first drop pattern with a third drop pattern. The third drop is a drop pattern that does not take into account overlay deviation or in-plane or out-of-plane displacement. The third drop pattern is a standard drop pattern that is based on a pattern of the substrate and a pattern of the template, among the other aspects. The third drop pattern may already be known or may be generated as part of the instant method. The third drop pattern may have been generated by (or be generated by) the processor 140 receiving a template pattern of the template 108 and also receiving a substrate pattern of the substrate 102. The template pattern may include information about the topography of the patterning surface 112 of the template 108. The topography of the patterning surface 112 may be measured and/or generated based on design data. The patterning surface 112 may be the same size as: an individual full field; multiple fields; the entire substrate, or larger than the substrate. The third drop pattern may also take into account information regarding the substrate, including information about substrate topography. The substrate pattern may include information about substrate topography of the representative substrate, a field of the representative substrate and/or a full field of the representative substrate. The substrate topography may be measured, generated based on previous fabrication steps, and/or generated based on design data. The substrate topography may include information about the shape of an edge such as a beveled edge or a rounded edge of the representative substrate. The substrate topography may include information about a shape and position of a reference edge which surrounds the area of the substrate on which patterns are to be formed.

The processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate, spatial variation in volume between the patterning surface and the substrate surface; fluid flow, evaporation; etc.

The step S408 of merging the drop pattern generated in step S406 (first drop pattern) and a standard drop pattern (third drop pattern), to generate the merged drop pattern (second drop pattern), is performed by adding the first drop pattern to the third drop pattern.

Figure 12A:
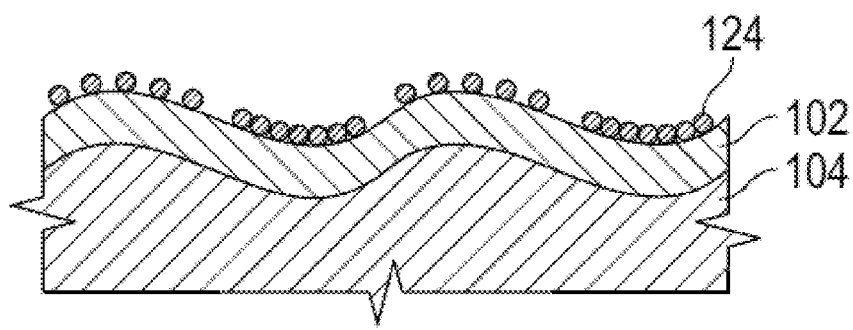
FIGS. 12A to 12C shows schematic sectional views of the imprint process in accordance with an example embodiment.

After generating the second drop pattern in step S408, the method may proceed to step S410 where drops of formable material are dispensed onto the substrate according to the second drop pattern. That is, drops are dispensed according the second drop pattern which includes both the drop pattern based on the equation 3 and the standard drop pattern. FIG. 12A shows a schematic sectional view of the imprint process where formable material 124 is dispensed onto the substrate 102 according to the second drop pattern. As shown in FIG. 13A, the substrate 102 has out-of-plane distortion and drops of formable material 124 are located at various densities on the surface of the substrate 102 after having been dispensed according to the second drop pattern.

Figure 12B:
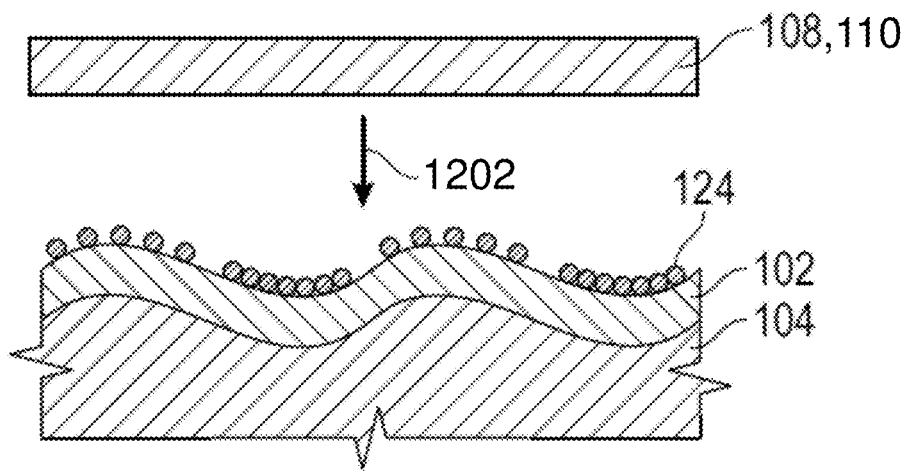
Figure 12C:
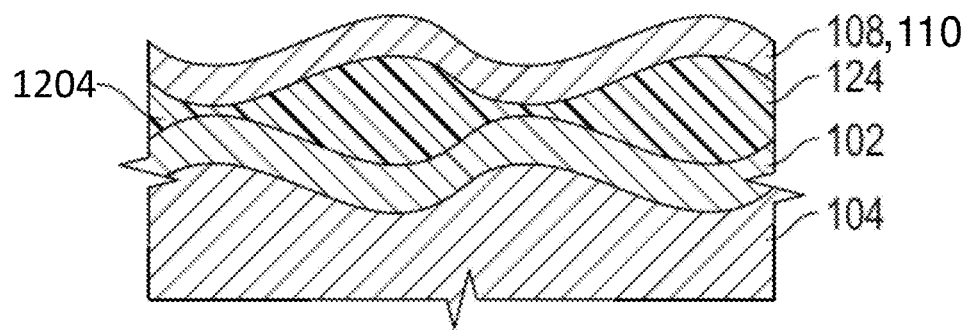

After the formable material 124 has been dispensed onto the substrate 102, the method may proceed to step S412, where the template (mesa) comes into contact with the dispensed formable material to form a film. FIG. 12B shows a schematic sectional view of the imprint process when the template 108 (mesa 110) is moving in a direction 1202 toward the formable material 124. Alternatively, the substrate may move toward the template or the template and substrate may move toward each other. FIG. 12C shows a schematic sectional view of the imprint process after the template 108 (mesa 110) has contacted the formable material 124 and formed a film 1204. As seen in FIG. 12C, because the formable material 124 was dispensed according to the second drop pattern (i.e., including the drop pattern based on the equation 1 merged with a standard drop pattern) the template 108 (mesa 110) includes out-of-plane distortion that is a mirror image of the out-of-plane distortion in the substrate 102.

After completing step S412, the method may then proceed with the same processing steps discussed above with respect to the overall imprinting method 300. That is, steps S410 of FIG. 4 corresponds to step S302 of FIG. 3 and step S412 of FIG. 4 corresponds to step S304 and S306, after which the equivalent steps of S308 (curing), S310 (separating) and S312 (processing) may be performed.

As discussed above, the nanofabrication method disclosed herein provides the benefit of compensating for deviations in the imprint system to improve overlay. As a result of using the fabrication method described herein, the overlay error between the second cured layer and an underlying layer of the substrate is reduced.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:
1. A nanofabrication method comprising:
receiving information regarding in-plane distortion of a substrate;
modeling target out-of-plane displacement of a template as a summation of a plurality of geometric modes, each geometric mode of the plurality of geometric modes represented by a linear combination of basis functions in two dimensions, wherein the plurality of geometric modes in the summation are modified using a plurality of unique predetermined correction coefficients, wherein each unique predetermined correction coefficient of the plurality of unique predetermined correction coefficients is assigned to a particular geometric mode of the plurality of geometric modes, and wherein each unique predetermined correction coefficient of the plurality of unique predetermined correction coefficients represents a relationship between:

a) an analytically determined amount of in-plane distortion caused to the template when the template is contacted with formable material dispensed according to a mode drop pattern based on the particular geometric mode, and b) an empirically determined amount of in-plane distortion caused to the template when the template is contacted with the formable material dispensed according to the mode drop pattern;

generating a first drop pattern of the formable material based on the modeled out-of-plane displacement of the template;

generating a second drop pattern by merging the first drop pattern with a third drop pattern, wherein the third drop pattern is based on a topography of the template and the substrate;

dispensing drops of the formable material onto the substrate according to the second drop pattern; and contacting the dispensed drops with the template to form a film.

2. The nanofabrication method of claim 1, wherein each geometric mode is a Fourier series.

3. The nanofabrication method of claim 2, each Fourier series includes a plurality of Fourier coefficients.

4. The nanofabrication method of claim 3, wherein each Fourier coefficient of the plurality of Fourier coefficients is based on the information regarding in-plane distortion of the substrate.

5. The nanofabrication method of claim 1, wherein the modeled target out-of-plane displacement of the template is represented by the following equation:

$$z(x, y) = \sum_{m,n=0}^{m,n=p} \frac{1}{E_{m,n}} [(a_{m,n} F_1(x, y)) + (b_{m,n} F_2(x, y)) + (c_{m,n} F_3(x, y)) + (d_{m,n} F_4(x, y))]$$

where $a_{m,n}$, $b_{m,n}$, $c_{m,n}$, and $d_{m,n}$ are Fourier coefficients, $$F_1(x, y) = \cos\frac{n\pi x}{L}\sin\frac{m\pi y}{H},$$

$$F_2(x, y) = \cos\frac{n\pi x}{L}\cos\frac{m\pi y}{H},$$

$$F_3(x, y) = \sin\frac{n\pi x}{L}\sin\frac{m\pi y}{H},$$

$$F_4(x, y) = \sin\frac{n\pi x}{L}\cos\frac{m\pi y}{H},$$

m and n are integers representing the plurality of geometric modes, p is an integer greater than 0, L is half a width of an imprint field of the template, H is half a height of the imprint field of the template, x is a value representing an X dimension location, y is a value representing a Y dimension location, $E_{m,n}$ is the unique correction coefficient, z(x,y) is a value representing out-of-plane displacement in terms of a Z dimension distance at a particular x,y location.

6. The nanofabrication method of claim 5, wherein p is from 1 to 6.

7. The nanofabrication method of claim 5, wherein p is 6.

8. The nanofabrication method of claim 5, wherein p is 3.

9. The nanofabrication method of claim 5, wherein $E_{m,n}$ is represented by the following equation:

$$E_{m,n} * B_{analytical,m,n} - B_{empirical,m,n} = 0,$$

wherein $B_{analytical,m,n}$ is the analytically determined amounts of in-plane distortion at a plurality of locations caused to the template when the template is contacted with formable material dispensed according to a mode drop pattern based on the particular geometric mode, and wherein $B_{empirical,m,n}$ is the empirically determined amounts of in-plane distortion at the plurality of locations caused to the template when the template is contacted with formable material dispensed according to the mode drop pattern.

10. The nanofabrication method of claim 9, wherein $E_{m,n}$ is from 0.1 to 1.

11. The nanofabrication method of claim 9, wherein $B_{empirical,m,n}$ is determined by:

generating the mode drop pattern based on the particular geometric mode;

dispensing the formable material according to the mode drop pattern;

contacting the template with the formable material dispensed according to the mode drop pattern;

measuring the in-plane deviation of the substrate.

12. The nanofabrication method of claim 11, wherein $B_{analytical,m,n}$ is determined by:

calculating out-of-plane displacement according to the following equation:

$$zmode_{m,n}(x, y) = \sin\left(\frac{n\pi x}{L}\right)\sin\left(\frac{m\pi y}{H}\right)$$

where $zmode_{m,n}(x,y)$ is out-of-plane displacement for the particular geometric mode at a particular x,y coordinate; and calculating in-plane distortion based on the calculated out-of-plane displacement.

13. The nanofabrication method of claim 5, wherein each of $a_{m,n}$, $b_{m,n}$, $c_{m,n}$, and $d_{m,n}$ are based on the information regarding in-plane distortion of the substrate and a thickness of the template.

14. The nanofabrication method of claim 1, wherein the information regarding in-plane distortion of the substrate includes overlay deviation in the X dimension and overlay deviation in the Y dimension.

15. The nanofabrication method of claim 1, wherein the information regarding in-plane distortion of the substrate comprises information regarding in-plane distortion of one or more full fields and/or one or more partial fields of the substrate.

16. The nanofabrication method of claim 15, wherein the modeling of target out-of-plane displacement of the template is based on the information regarding in-plane distortion of the one or more full fields and/or the one or more partial fields.

17. The nanofabrication method of claim 15, wherein each unique predetermined correction coefficient assigned to a geometric mode used to model the target out-of-plane displacement for the one or more full fields is different form each unique predetermined correction coefficient assigned to a geometric mode used to model the target out-of-plane displacement for the one or more partial fields.

18. The nanofabrication method of claim 15, wherein the information regarding in-plane distortion of the substrate comprises information regarding in-plane distortion of one or more full fields and/or one or more partial fields of a plurality of substrates.

19. A method of making an article, comprising:
- receiving information regarding in-plane distortion of a substrate;
- modeling a target out-of-plane displacement of a template as a summation of a plurality of geometric modes, each geometric mode of the plurality of geometric modes represented by a linear combination of basis functions in two dimensions,
- wherein the plurality of geometric modes in the summation are modified using a plurality of unique predetermined correction coefficients,
- wherein each unique predetermined correction coefficient of the plurality of unique predetermined correction coefficients is assigned to a particular geometric mode of the plurality of geometric modes, and
- wherein each unique predetermined correction coefficient of the plurality of unique predetermined correction coefficients represents a relationship between:
  - a) an analytically determined amount of in-plane distortion caused to the template when the template is contacted with formable material dispensed according to a mode drop pattern based on the particular geometric mode, and
  - b) an empirically determined amount of in-plane distortion caused to the template when the template is contacted with formable material dispensed according to the mode drop pattern;
- generating a first drop pattern of formable material based on the modeled out-of-plane displacement of the template;
- generating a second drop pattern by merging the first drop pattern with a third drop pattern, wherein the third drop pattern is based on a topography of the template and the substrate;
- dispensing drops of formable material according to the second drop pattern onto the substrate; and
- contacting the template with the dispensed drops, thereby forming a pattern of the dispensed drops on the substrate; and
- processing the formed pattern or layer to make the article.

* * * * *